United States Patent
Makley et al.

(10) Patent No.: US 8,098,489 B2
(45) Date of Patent: Jan. 17, 2012

(54) INTEGRATED THERMAL SYSTEM FOR COOLING MULTIPLE SEPARATE COMPONENTS OF AN ELECTRONIC DEVICE

(75) Inventors: Albert V. Makley, Morrisville, NC (US); William F. Martin-Otto, Apex, NC (US); Marc R. Pamloy, Durham, NC (US); Timothy S. Farrow, Cary, NC (US)

(73) Assignee: Lenovo (Singapore) Pte. Ltd., Singapore (SG)

( * ) Notice: Subject to any disclaimer, the term of this patent is extended or adjusted under 35 U.S.C. 154(b) by 201 days.

(21) Appl. No.: 12/412,516

(22) Filed: Mar. 27, 2009

(65) Prior Publication Data

US 2010/0243205 A1 Sep. 30, 2010

(51) Int. Cl.
*H05K 7/20* (2006.01)
*F28F 7/00* (2006.01)

(52) U.S. Cl. ....... 361/697; 165/80.2; 165/185; 361/694; 361/700

(58) Field of Classification Search ........................ None
See application file for complete search history.

(56) References Cited

U.S. PATENT DOCUMENTS

| | | | | |
|---|---|---|---|---|
| 5,873,407 | A * | 2/1999 | Wang et al. | 165/80.3 |
| 6,989,988 | B2 * | 1/2006 | Arbogast et al. | 361/695 |
| 7,120,018 | B2 * | 10/2006 | Shen et al. | 361/695 |
| 7,215,548 | B1 * | 5/2007 | Wu et al. | 361/703 |
| 7,443,676 | B1 * | 10/2008 | Li | 361/700 |
| 7,766,074 | B2 * | 8/2010 | Lin et al. | 165/80.2 |
| 2006/0274504 | A1 * | 12/2006 | Yao et al. | 361/704 |
| 2007/0261822 | A1 * | 11/2007 | Lin et al. | 165/104.33 |

* cited by examiner

*Primary Examiner* — Gregory Thompson
(74) *Attorney, Agent, or Firm* — Ference & Associates LLC

(57) ABSTRACT

The invention broadly contemplates an integrated thermal system that is capable of simultaneously cooling multiple, separate heat generating components of an electronic device. The integrated thermal system according to one embodiment of the invention takes the form of a CPU heat sink designed to intelligently maximize available airflow, utilizing multidirectional airflow cooling of a plurality of heat generating components on the motherboard. The heat sink is designed such that airflow provided by a single fan is captured and directed to nearby/adjacent components, thus cooling these components. The invention thus provides an integrated cooling solution and removes the need for multiple cooling systems/solutions.

20 Claims, 5 Drawing Sheets

INTEGRATED THERMAL SYSTEM FOR COOLING MULTIPLE SEPARATE COMPONENTS OF AN ELECTRONIC DEVICE

FIELD OF THE INVENTION

The invention relates to the cooling of multiple, separated components of an electronic device. More particularly, the invention provides an integrated thermal system capable of cooling multiple, separated components simultaneously.

BACKGROUND OF THE INVENTION

The problem of cooling multiple, separated components on a motherboard of an electronic device (e.g. a desktop workstation server—a tower system) has heretofore been solved using multiple, separated cooling components, e.g. heat sinks, fan sinks, etc. Dedicated air moving devices and/or multiple heat sinks are typically used to cool multiple, separated heat generating components of the motherboard, such as voltage regulation components, memory controller hubs, and the central processing unit (CPU). Thus, a combination of thermal solutions are employed to provide cooling to multiple components, each of the components having at least one dedicated cooling component (e.g. heat sink and/or fan) providing at least one thermal solution (e.g. conductive cooling, airflow). Thus, the cooling of multiple, separated components currently involves a high cost, as each heat generating component requires a dedicated cooling solution.

Accordingly, a need has arisen to provide for cooling of multiple, separated components in a more efficient and cost effective manner.

SUMMARY OF THE INVENTION

At least one presently preferred embodiment of the invention broadly contemplates an integrated thermal system that is capable of simultaneously cooling multiple, separated heat generating components of an electronic device. According to at least one embodiment, the integrated thermal system takes the form of a CPU heat sink designed to intelligently maximize available airflow, utilizing multidirectional airflow to simultaneously cool a plurality of heat generating components on the motherboard. The heat sink is designed such that it captures additional airflow provided by a single fan and directs the additional airflow to nearby/adjacent components, thus cooling these components. The additional airflow may be taken from a lower portion of the fan because use of this airflow is not maximized in conventional heat sink arrangements. The invention thus provides an integrated cooling solution and removes the need for multiple cooling systems/solutions (e.g. no need for multiple fans).

In summary, an aspect of the present invention provides an apparatus comprising: at least one central processing unit; and an integrated thermal device operatively coupled to the at least one central processing unit and configured to channel airflow from an airflow source to a plurality of separate heat generating components.

Another aspect of the present invention provides an apparatus comprising: a heat sink base disposed on a heat generating component; at least one deflector; and a heat sink component; wherein the heat sink component, the heat sink base and the at least one deflector form at least one airflow channel configured to channel airflow to at least one other heat generating component.

A further aspect of the present invention provides an apparatus comprising: at least one processor; and a heat sink base of a first heat generating component, the heat sink base having at least one airflow channel therein; and a fan arrangement operatively couple to said at least one processor and configured to provide airflow to the at least one airflow channel; wherein the at least one airflow channel is configured to provide airflow for at least one other heat generating component.

For a better understanding of the present invention, together with other and further features and advantages thereof, reference is made to the following description, taken in conjunction with the accompanying drawings, and the scope of the invention will be pointed out in the appended claims.

DETAILED DESCRIPTION OF THE PREFERRED EMBODIMENTS

Figure 1:
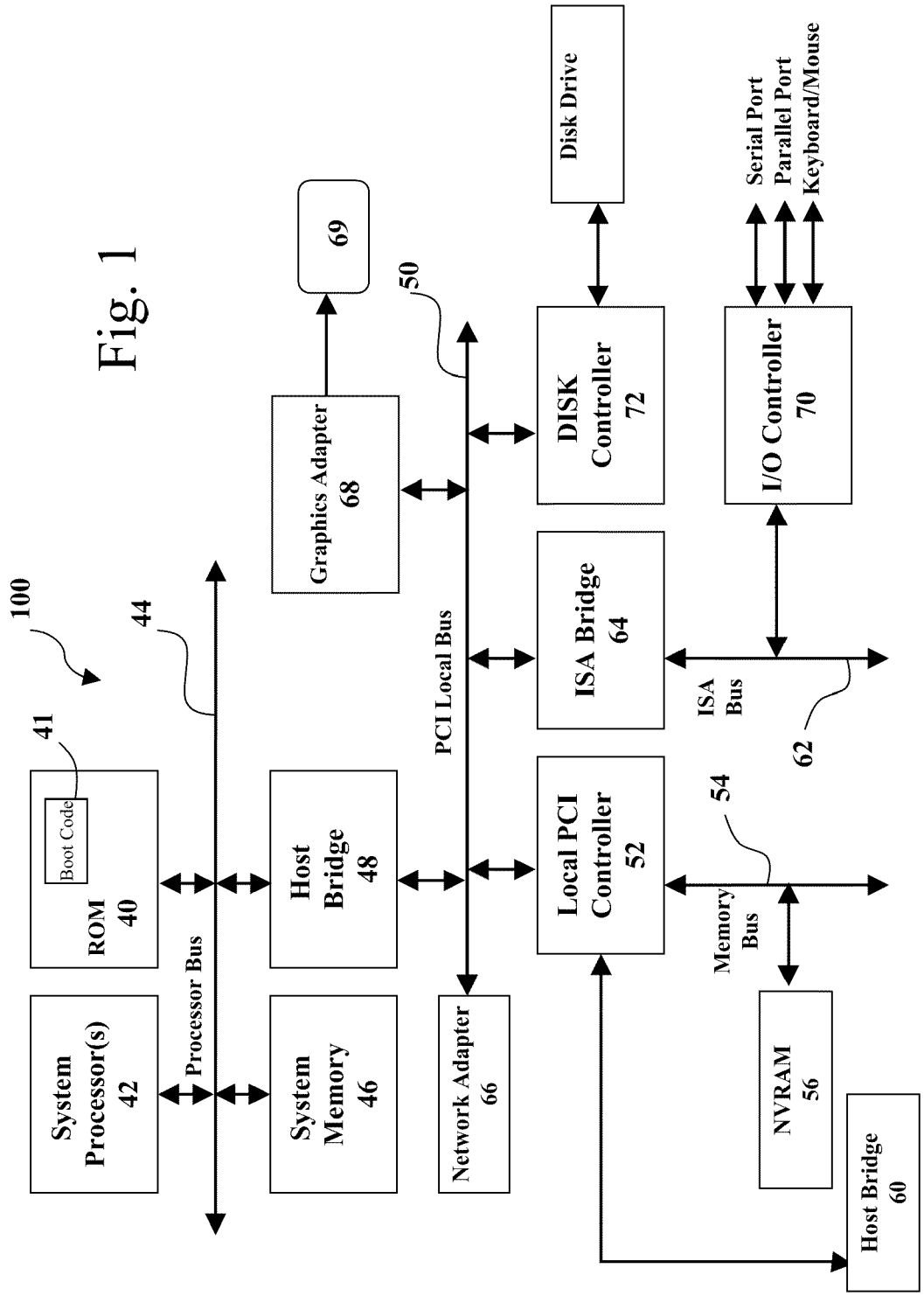
FIG. 1 shows a block diagram of a computer system.

It will be readily understood that the components of the present invention, as generally described and illustrated in the figures herein, may be arranged and designed in a wide variety of different configurations in addition to the described presently preferred embodiments. Thus, the following more detailed description of the embodiments of the present invention, as represented in the figures, is not intended to limit the scope of the invention, as claimed, but is merely representative of selected presently preferred embodiments of the invention.

Reference throughout this specification to "one embodiment" or "an embodiment" (or the like) means that a particular feature, structure, or characteristic described in connection with the embodiment is included in at least one embodiment of the present invention. Thus, appearances of the phrases "in one embodiment" or "in an embodiment" or the like in various places throughout this specification are not necessarily all referring to the same embodiment.

Furthermore, the described features, structures, or characteristics may be combined in any suitable manner in one or more embodiments. In the following description, numerous specific details are provided to give a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

The illustrated embodiments of the invention will be best understood by reference to the drawings. The following description is intended only by way of example, and simply illustrates certain selected presently preferred embodiments that are consistent with the invention as claimed herein.

The following description begins with a general overview of the instant invention. The description will then turn to a more detailed description of preferred embodiments of the invention with reference to the accompanying drawings.

According to one embodiment of the present invention, an integrated thermal system, which comprises a dedicated heat sink arrangement for cooling the CPU, maximizes the use of extra or additional airflow by using it to cool multiple components. The integrated thermal system enables this extra airflow to be collected and channeled/dispersed to nearby components that require cooling. Airflow is captured from the inefficient portion of the conventional fan/heat sink arrangement (i.e. where the heat pipes are bent and the fins cannot be effectively attached). This airflow is normally wasted because, at best, it provides only minimal cooling to the CPU (i.e. minimal cooling to a heat generating component). Often heat sink arrangements are configured to have thick bases (e.g. aluminum blocks), and the airflow from the bottom of the fan (e.g. bottom 20% of the fan) is blocked off. Thus, only the top 80% or so of the fan is utilized for cooling airflow to the CPU heat sink fins. Alternatively, the fan is positioned higher up and wholly directed through the fins (servicing only one component—e.g. the CPU). The integrated thermal system makes a more beneficial use of airflow for cooling multiple components simultaneously.

Accordingly, the integrated thermal system's heat sink arrangement is designed to redirect or channel the airflow not only through the CPU heat sink fins, but also to cool multiple, separate components on the motherboard, using a single fan. The heat sink base of the integrated thermal system is provided with deflectors. The features used to direct airflow (deflectors) are also heat exchanger features, because they can be coupled to the base to add as surface area of the main heat sink. These deflectors are positioned such that a portion of the airflow form the fan, normally directed to an area of the heat sink where it is difficult to provide fins, is channeled/deflected to the left, the right, and/or the back (opposite the fan) of the heat sink arrangement. The airflow is thus channeled appropriately to cool separate heat generating components, i.e. those located to the left, right, and back side of the motherboard relative to the location of the CPU.

Referring now to the figures, at least one presently preferred embodiment of the present invention will be described.

Referring now to FIG. 1, there is depicted a block diagram of an illustrative embodiment of a computer system 100. The illustrative embodiment depicted in FIG. 1 may be a notebook computer system, such as one of the ThinkPad® series of personal computers sold by Lenovo (US) Inc. of Morrisville, N.C. or a workstation computer, such as the Thinkstation®, which is also sold by Lenovo (US) Inc. of Morrisville, N.C. As is apparent from the description, however, the present invention is applicable any data processing system or other electronic device, as described herein.

As shown in FIG. 1, computer system 100 includes at least one system processor 42, which is coupled to a Read-Only Memory (ROM) 40 and a system memory 46 by a processor bus 44. System processor 42, which may comprise one of the processors produced by Intel Corporation, is a general-purpose processor that executes boot code 41 stored within ROM 40 at power-on and thereafter processes data under the control of operating system and application software stored in system memory 46. System processor 42 is coupled via processor bus 44 and host bridge 48 to Peripheral Component Interconnect (PCI) local bus 50.

PCI local bus 50 supports the attachment of a number of devices, including adapters and bridges. Among these devices is network adapter 66, which interfaces computer system 100 to LAN 10, and graphics adapter 68, which interfaces computer system 100 to display 69. Communication on PCI local bus 50 is governed by local PCI controller 52, which is in turn coupled to non-volatile random access memory (NVRAM) 56 via memory bus 54. Local PCI controller 52 can be coupled to additional buses and devices via a second host bridge 60.

Computer system 100 further includes Industry Standard Architecture (ISA) bus 62, which is coupled to PCI local bus 50 by ISA bridge 64. Coupled to ISA bus 62 is an input/output (I/O) controller 70, which controls communication between computer system 100 and attached peripheral devices such as a keyboard, mouse, and a disk drive. In addition, I/O controller 70 supports external communication by computer system 100 via serial and parallel ports (e.g. to a keyboard as herein described, the keyboard being operatively coupled to the components of the system to enable a user to execute the functionality of the system). The USB Bus and USB Controller (not shown) are part of the Local PCI controller (52).

Figure 2:
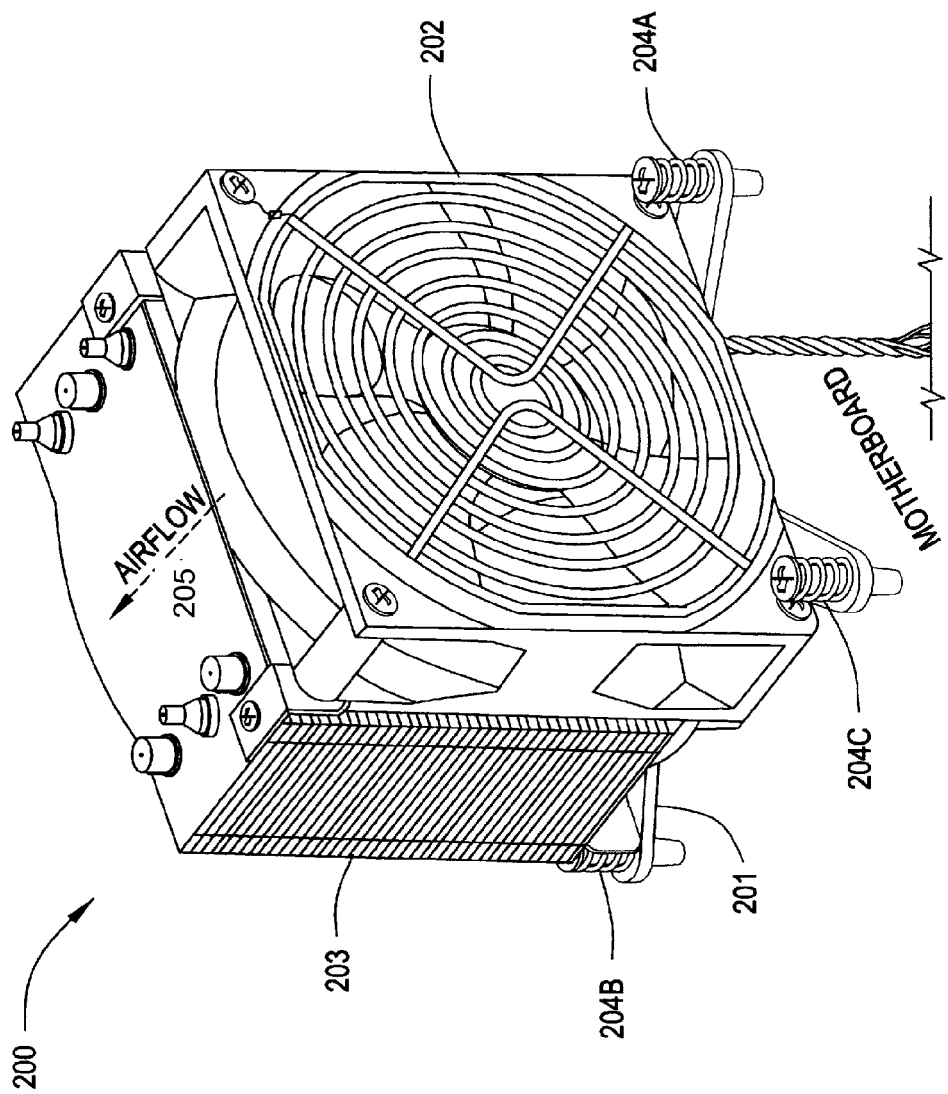
FIG. 2 illustrates an integrated thermal system according to an embodiment of the invention.

FIG. 2 shows the integrated thermal system (200). The integrated thermal system (200) comprises a heat sink base (201), a fan (202) arranged to direct airflow (205) in the direction of fins (203) of the heat sink, extending up from the base (201) to provide cooling for the CPU (not shown) (the CPU being disposed on the motherboard and underneath the integrated thermal system). It should be noted that the arrangement shown in FIG. 1 is a parallel airflow system (airflow (205) emanating from the fan is parallel to the motherboard) as opposed to an impingement airflow system. A parallel airflow system is presently preferred because typically there is more surface area for cooling, the heat exchanger can be a bit larger and the pressure drop through the fins is a bit less, because the airflow is not impinging right into the motherboard, increasing the static pressure.

The integrated thermal system (200) is connected to the motherboard via suitable attachments, as by screw(s) (204a, 204b, 204c) as shown in FIG. 2. The integrated thermal system (200) airflow (205) is captured from the inefficient portion. Generally, this is near the heat sink base (201) in a parallel airflow arrangement (where the heat pipes are bent and fins cannot be effectively attached). In other words, airflow is captured and channeled from a portion of the fan that is not providing maximum cooling to the heat sink arrangement (e.g. the "lower" 20% of the fan as depicted in FIG. 1). The heat sink base (201) can be reduced in thickness, creating additional room for airflow channels (described below). The airflow is thus channeled to areas for more beneficial use, as further described below.

Figure 3:
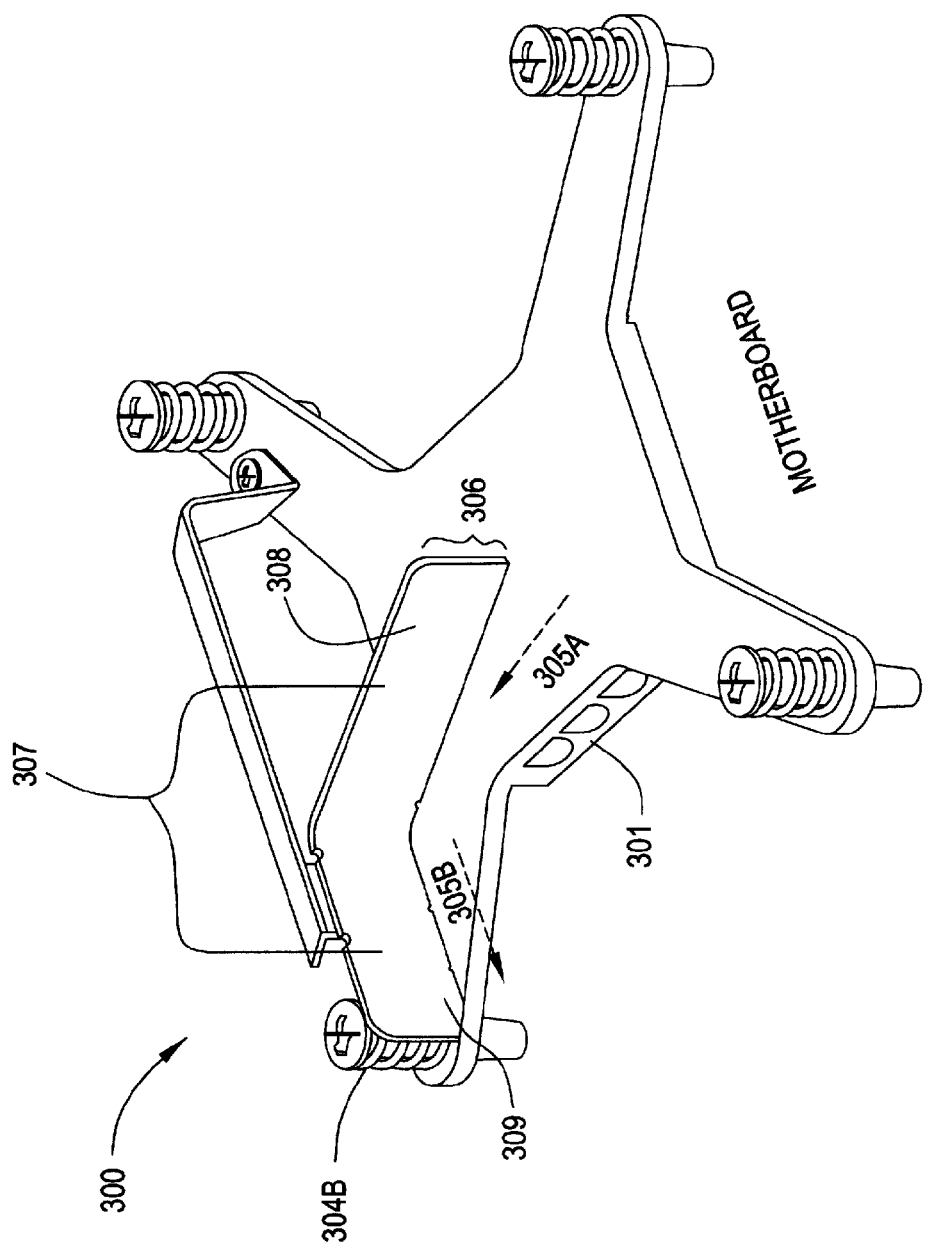
FIG. 3 illustrates an integrated thermal system according to an embodiment of the invention with certain components removed to better view an exemplary airflow.

FIG. 3 illustrates a first example of redirected airflow from fan (202) through the integrated thermal system (300). In FIG. 2, the upper portion of the integrated thermal system (300) has been removed (including the fan (202), the fins (203) and the heat pipes), such that an unobstructed view of the airflow through the components of the remaining integrated thermal system (300) can be had. Illustrated in FIG. 3 is one of the features that is used to redirect some of the additional airflow (305a) from the lower portion of the fan (202), redirecting the airflow (305a) ultimately out to the left side of the heat sink base (301). This redirected airflow thus becomes a leftward-directed airflow (305b), channeled to a component (not shown) that rests on motherboard to the left side of the CPU (which is located below the heat sink base (301)).

Thus, a left airflow channel (307) is formed by a first deflector (306), bounded at the bottom by the heat sink base (301) and bounded at the top by a component (e.g. an plate as shown and described below). The first deflector (306) is suitably shaped to capture airflow (305a) from a portion of the fan (202) and direct it to the left of the heat sink base (301) to a component on the motherboard to the left of the CPU. The first deflector (306) has two major shape features, a first element (308) that initially conducts airflow (305a) slightly to the left of the heat sink base (301), and a second element (309) that conducts the airflow more directly out to the left of the heat sink base (301). The first element (308) is positioned near the center of the heat sink base (301) and conducts airflow (305a) towards the back-left of the heat sink base (301). The second element (309), positioned to terminate at the back of the heat sink base (301) (near screw (304b)), more abruptly redirects airflow (305a) to produce a leftward airflow (305b). The first deflector (306) can be suitably arranged to produce airflow (305b), however, the first deflector (306) shown in FIG. 3, as a non-limiting example, is a single metal piece (comprising both the first and second elements) shaped (e.g. stamped) to conduct the airflow as described.

Thus, the airflow (305a) becomes leftward-directed airflow (305b), i.e. an airflow (305b) provided to a separate component located on the motherboard to the left of the CPU. As can be appreciated, normally the airflow (305a) would proceed underneath the heat fins (203) (i.e. out the back of the heat sink) and effect the cooling of the CPU only very minimally. Alternatively, if the heat sink base (301) were thicker, airflow from the lower portion of the fan may be blocked off entirely. The integrated thermal system thus captures this airflow and makes a more beneficial use of it, i.e. to cool additional heat generating components.

Airflow (305b) out the left side of the heat sink is used for, but not limited to, cooling the I/O Hub, which requires dedicated airflow in order to meet thermal requirements. Using existing airflow, instead of attaching an additional air-moving device, saves cost and acoustic propagation (i.e. reduces noise).

Figure 4:
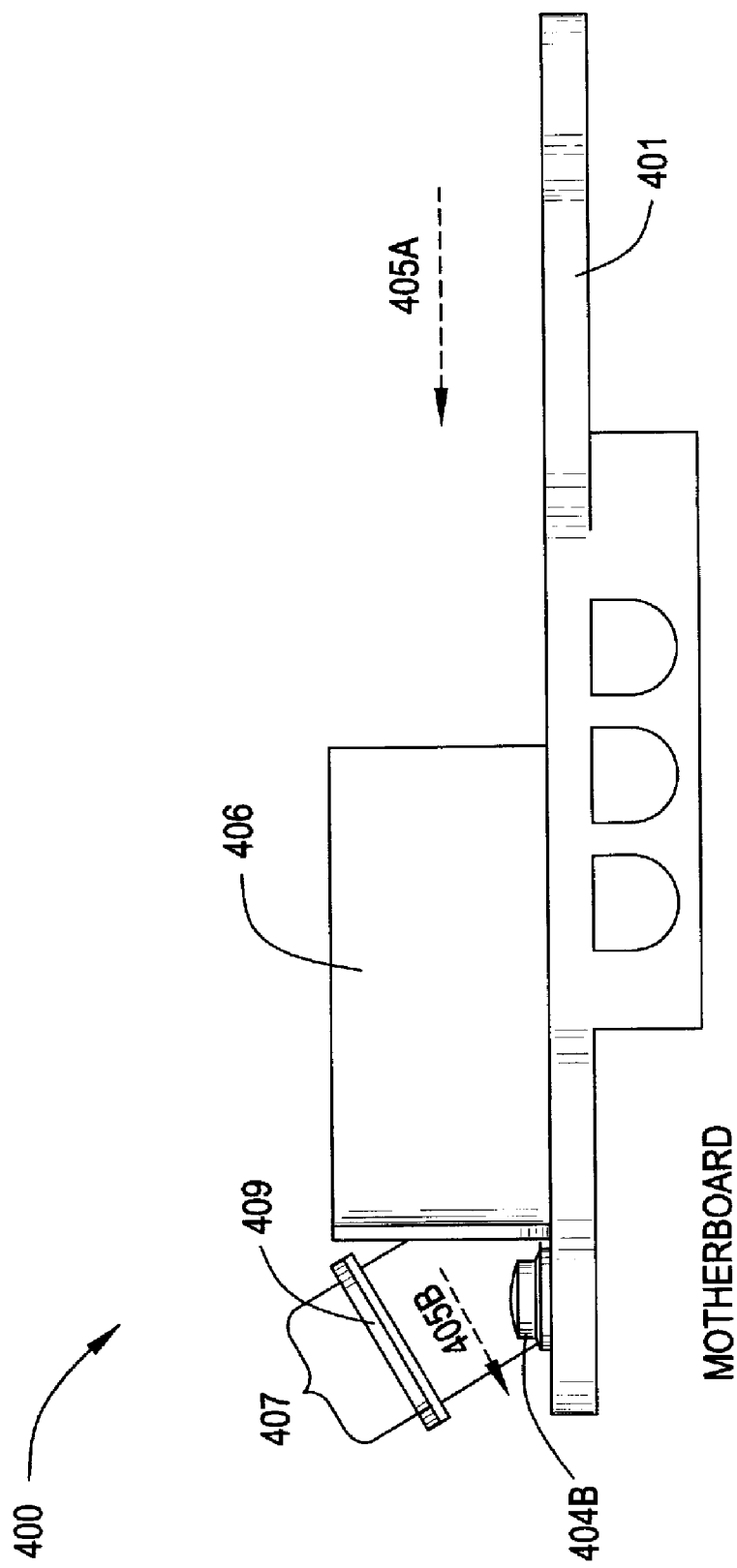
FIG. 4 illustrates a side view of an integrated thermal system according to one embodiment of the invention with certain components removed to better view an exemplary airflow.

FIG. 4 is a left-side view of the remaining integrated thermal system (400), as shown in FIG. 3 (300), with the first deflector (406) remaining but with the top components again removed, so that a view of additional airflow (405b) through the integrated thermal system (400) may be had. FIG. 4 shows that airflow (405a) that is not captured by the first deflector (406) (e.g. airflow from fan (202) that is to the right side of first element (308)) is deflected down by a second deflector (409), positioned at the back side of the heat sink (401). Airflow (405b) is thus created, directed downward towards the motherboard at the back of the heat sink base (401), to cool other, separate components. Thus, a back-most airflow channel (407) is formed from a component (e.g. a plate as shown and described below), the heat sink base (401), the first (406) and the second deflectors (409). Airflow (405b) out the right side of the heat sink (401) is used for, but not limited to, cooling of the CPU voltage regulation.

Figure 5:
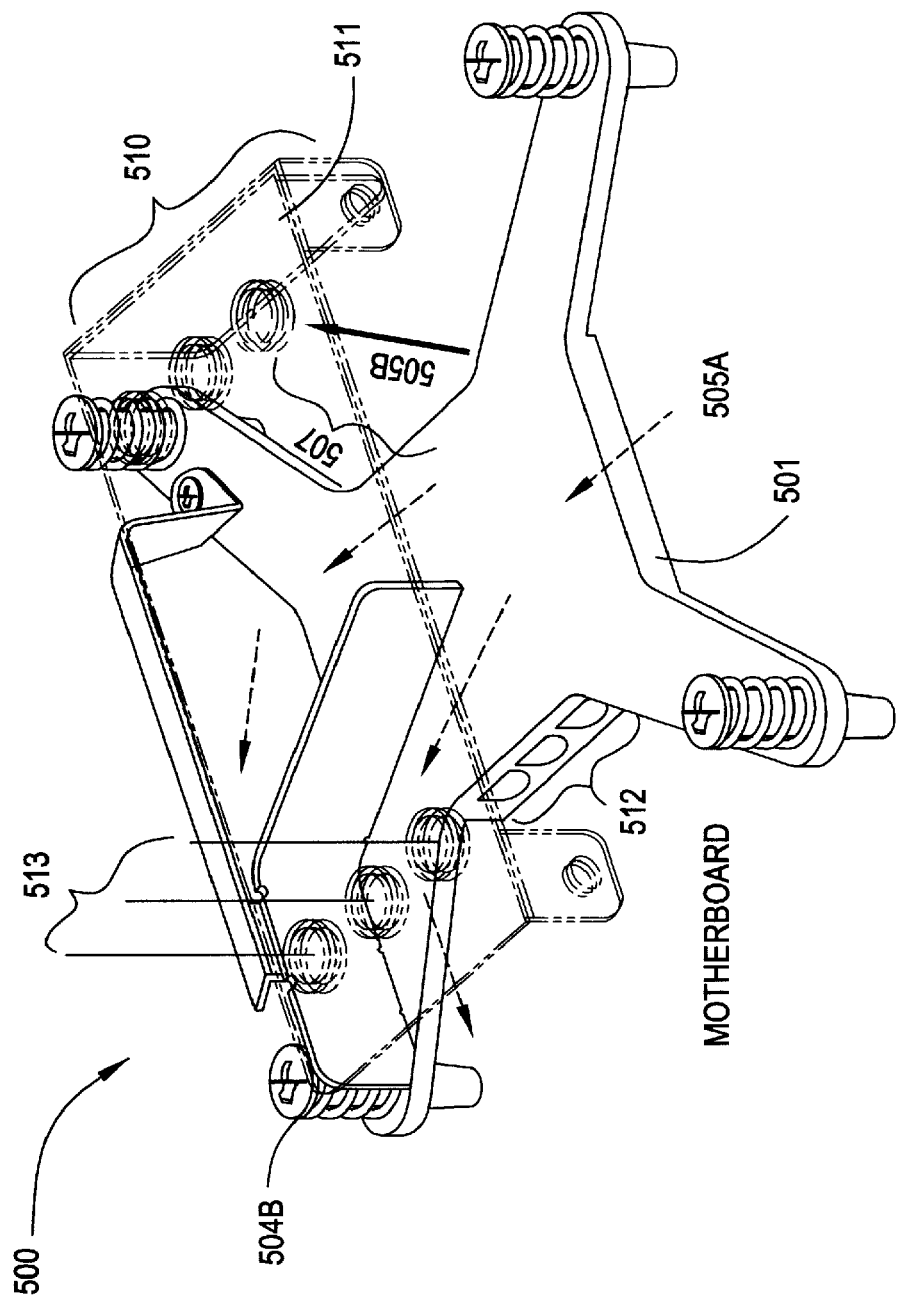
FIG. 5 illustrates an integrated thermal system according to one embodiment of the invention with select components included to better view exemplary airflow.

FIG. 5 illustrates the remaining integrated thermal system (500), as shown in FIG. 3 (300), with additional components and again with the upper most components removed for an unobstructed view. As described, airflow (505a) from the fan (202) that is not captured by the first deflector (306), may proceed to the back of the heat sink base (501), i.e. through the back-most airflow channel (407). A portion of this airflow (505a) will proceed naturally to the right side of the heat sink base (501), until encountered by a third deflector (510), formed from a heat sink component (511), such as a plate as shown in FIG. 4. The third deflector (510) extends downward from the heat sink component (511) and is positioned to the right side of the heat sink base (501). Accordingly, airflow (505a) that is not channeled through the left airflow channel (307) or the back-most airflow channel (407) will be deflected by the third deflector (510) towards the right side of the heat sink base (501). This airflow (505b) spills air down to the right side of the heat sink base (501) for cooling an additional, separate heat-generating component (not shown) on the motherboard.

Thus, the third deflector (510), the heat sink base (501) and a portion of the heat sink component (511) form a right airflow channel (507), such that airflow is spilled off the right side of the heat sink base (501) to an additional component. This airflow (505b) is pushed down towards the motherboard by the third deflector (510), cooling component(s) positioned on the right side of the heat sink base (501).

A heat sink component (511) (e.g. a aluminum plate as depicted in FIG. 5) forms the top bound of the airflow channels (307, 407, 507), as heretofore described. The dedicated heat sink component (511), such as that shown in FIG. 5, can be used, or alternatively other component(s) could be used, so long as the desired airflow channel(s) result. As described, the heat sink component (511) provides additional downward direction to airflow (505b) by providing the third deflector (510) that forces airflow (505b) down towards the motherboard as it exits heat sink base (501). Also shown in heat sink component (511) are holes (513) that allow the heat pipes (not shown) to pass through, extending from holes (512) in heat sink base (501). Airflow (505b) out the right side of the heat sink base (501) is used for, but not limited to, cooling of the CPU voltage regulation arrangement.

In brief recapitulation, an integrated thermal system for an electronic device has been shown and described that provides multidirectional airflow cooling for heat generating components (e.g. I/O components) of electronic devices utilizing a single fan and multiple airflow channels. The integrated thermal system provides additional airflow, taken from the bottom portion of the fan, to various sides (e.g. a left, right and/or back side) of a heat sink (e.g. a main CPU heat sink). The integrated thermal system directs airflow by way of an appropriate amount of deflectors and/or components, strategically placed to capture additional airflow from a cooling fan. The additional airflow, thus captured and channeled, although conventionally wasted (in essence) as it provides only minimal cooling to the CPU (heat generating component) by virtue of its location, is put to maximum use. Accordingly, the integrated thermal system provides a more efficient use of airflow, providing cooling to multiple, separated heat generating components on the motherboard without requiring additional dedicated cooling components/systems.

This disclosure has been presented for purposes of illustration and description but is not intended to be exhaustive or limiting. Many modifications and variations will be apparent to those of ordinary skill in the art. The embodiments were chosen and described in order to explain principles and practical application, and to enable others of ordinary skill in the art to understand the disclosure for various embodiments with various modifications as are suited to the particular use contemplated.

In the drawings and specification there has been set forth a preferred embodiment of the invention and, although specific terms are used, the description thus given uses terminology in a generic and descriptive sense only and not for purposes of limitation.

If not otherwise stated herein, it is to be assumed that all patents, patent applications, patent publications and other publications (including web-based publications) mentioned and cited herein are hereby fully incorporated by reference herein as if set forth in their entirety.

What is claimed is:

1. An apparatus comprising:
at least one central processing unit; and
an integrated thermal device operatively coupled to the at least one central processing unit and configured to channel airflow from an airflow source to a plurality of separate heat generating components via one or more airflow channels, said one or more airflow channels being configured to channel airflow at least in part over a heat sink base surface facing a set of fins and beneath said set of fins, wherein said one or more airflow channels is devoid of fins and contains a deflector therein.

2. The apparatus according to claim 1, wherein the plurality of separate heat generating components comprises a central processing unit voltage regulation arrangement.

3. The apparatus according to claim 2, wherein the plurality of separate heat generating components further comprises an I/O hub.

4. The apparatus according to claim 1, wherein the integrated thermal device further comprises:
at least one airflow conducting component, wherein the at least one airflow conducting component is configured to at least partially define said one or more airflow channels.

5. The apparatus according to claim 4, wherein the one or more airflow channels delivers airflow directly to the plurality of separate heat generating components.

6. The apparatus according to claim 4, wherein the at least one airflow conducting component comprises:
a heat sink base disposed on a first one of the plurality of separate heat generating components;
a heat sink component comprising a plate separating said set of fins from the heat sink base; and
at least one deflector;
wherein the heat sink component, the heat sink base and the at least one deflector form the one or more airflow channels.

7. The apparatus according to claim 6, wherein the at least one deflector comprises:
a first deflector disposed on a first side of the heat sink base;
a second deflector disposed on a second side of the heat sink base; and
a third deflector disposed on a third side of the heat sink base.

8. The apparatus according to claim 7, wherein the one or more airflow channels further comprises:
a first airflow channel;
a second airflow channel; and
a third airflow channel;
wherein a surface of the heat sink base facing a set of fins, the heat sink component, and the first deflector form the first airflow channel;
wherein the surface of the heat sink base facing the set of fins, the heat sink component, the first deflector, and the second deflector form the second airflow channel; and
wherein the surface of the heat sink base facing the set of fins, the heat sink component, and the third deflector form the third airflow channel.

9. The apparatus according to claim 6, wherein the airflow source comprises:
a fan arrangement, the fan arrangement having a first portion and a second portion; the first portion being configured to direct the airflow through the set of fins which are thermally connected to the heat sink base, the second portion being configured to direct the airflow through the one or more airflow channels.

10. An apparatus comprising:
a heat sink base disposed on a first heat generating component;
at least one deflector; and
a heat sink component comprising a plate separating a set of fins from the heat sink base;
wherein the heat sink component, a surface of the heat sink base facing the set of fins and the at least one deflector form at least one airflow channel configured to channel airflow to at least one other heat generating component.

11. The apparatus according to claim 10, wherein the first heat generating component comprises a central processing unit.

12. The apparatus according to claim 11, wherein:
the at least one deflector comprises a plurality of deflectors;
the at least one airflow channel comprises a plurality of airflow channels; and
the plurality of deflectors, the heat sink component and a surface of the heat sink base facing the set of fins form the plurality of airflow channels.

13. The apparatus according to claim 12, wherein:
the at least one other heat generating component of the electronic device comprises a plurality of heat generating components; and
the plurality of airflow channels are configured to provide airflow to the plurality of heat generating components.

14. The apparatus according to claim 13, wherein the plurality of heat generating components comprise:
a central processing unit voltage regulation arrangement; and
an I/O hub.

15. The apparatus according to claim 13, wherein:
the plurality of airflow channels comprise:
a first airflow channel;
a second airflow channel; and
a third airflow channel; and
the first airflow channel, the second airflow channel, and the third airflow channel are configured to channel airflow to cool a first, a second and a third heat generating component of the plurality of heat generating components.

16. An apparatus comprising:
at least one processor; and
a heat sink base of a first heat generating component, the heat sink base having at least one airflow channel therein; and
a fan arrangement operatively couple to said at least one processor and configured to provide airflow to the at least one airflow channel and to a separate plurality of airflow channels defined by a plurality of fins;
wherein the at least one airflow channel is configured to provide airflow over a surface of the heat sink base facing the fins without passing through the fins for at least one other heat generating component.

17. The apparatus according to claim 16, wherein the heat sink base has a lower surface; and
wherein the lower surface of the heat sink base is disposed on the first heat generating component.

18. The apparatus according to claim 17, further comprising at least one deflector;
wherein the at least one deflector is disposed on the surface of the heat sink base facing the fins.

19. The apparatus according to claim 18, further comprising:
 a heat sink component;
 wherein the heat sink component is suitably positioned between the fins and the at least one deflector to conduct air flow from the fan arrangement to the at least one airflow channel.

20. The apparatus according to claim 16, wherein the first heat generating component comprises the at least one central processing unit.

* * * * *